US005565727A

United States Patent [19]

Pöschl

[11] Patent Number: 5,565,727

[45] Date of Patent: Oct. 15, 1996

[54] HOLDER FOR ULTRASONIC POWER CONVERTERS

[75] Inventor: Günter Pöschl, Schwaikheim, Germany

[73] Assignee: PPV-Verwaltungs-AG, Zurich, Switzerland

[21] Appl. No.: 351,392

[22] PCT Filed: Jun. 17, 1993

[86] PCT No.: PCT/EP93/01544

§ 371 Date: Dec. 9, 1994

§ 102(e) Date: Dec. 9, 1994

[87] PCT Pub. No.: WO94/00835

PCT Pub. Date: Jan. 6, 1994

[30] Foreign Application Priority Data

Jun. 19, 1992 [DE] Germany .......................... 42 20 205.1

[51] Int. Cl.[6] .................................................. H01L 111/08

[52] U.S. Cl. ............................................................ 310/324

[58] Field of Search .................................... 310/323, 324, 310/345

[56] References Cited

U.S. PATENT DOCUMENTS 2,430,013 11/1947 Hansell .................................. 310/324

5,306,981 4/1994 Martel et al. ............................ 310/323

FOREIGN PATENT DOCUMENTS

| | | | |
|---|---|---|---|
| 0547921 | 10/1957 | Canada | 310/338 |
| 0495506 | 7/1992 | European Pat. Off. | F23K 5/10 |
| 1101831 | 3/1961 | Germany | 310/324 |
| 2639164 | 3/1978 | Germany | 310/338 |
| 4101303 | 7/1992 | Germany | F23D 11/24 |
| 2096860 | 10/1982 | United Kingdom | H04R 17/10 |

*Primary Examiner*—Thomas M. Dougherty
*Attorney, Agent, or Firm*—Panitch Schwarze Jacobs & Nadel, P.C.

[57] ABSTRACT

Liquid impinges on two sides (15, 17) of a plate (11) of piezoelectric material, for the liquid to be exposed to ultrasonic waves by the plate (11) oscillating at ultrasonic frequency. An electric voltage is uniformly applied to the two sides (15, 17) of the plate (11) at its peripheral edge via annular contact plates (27). The contact plates (27) have resilient fingers (31) bent towards the plate (11) for transferring the voltage on the one hand and for uniformly clamping the plate (11) on the other. To prevent the liqui from short-circuiting the plate (11), a seal (21) is located at the periphery of the plate (11) and is compressed for tightness between the plate (11), and intermediate ring (25) and the contact plates (27). An upper and a lower annular disc (19, 23) serve for better sealing and clamping of the plate (11).

11 Claims, 2 Drawing Sheets

HOLDER FOR ULTRASONIC POWER CONVERTERS

TECHNICAL FIELD

This invention refers to a holder according to claim 1.

BACKGROUND ART

The function of ultrasonic power converters is based on the reversal of the piezoelectric effect. By application of a voltage to the opposite sides (hereinafter referred to as upper and lower sides) of a plate of piezoelectric material, the plate is caused to ultrasonically oscillate. For this purpose, plates of piezoelectric material are provided with a complete electrically conductive coating, preferably a silver coating, on their upper and lower sides, with one wire each, connected to a voltage source, being soldered onto the same. The coating of the upper and lower sides of the plate is necessary, as the electric voltage would otherwise only be more or less punctually transferred to the piezoelectric material at the soldered joint. Contrary to this, with the coating the voltage is transferred onto the entire upper and/or lower side of the plate.

One known form of application of ultrasonic power converters is their use in quartz clocks.

In addition, ultrasonic power converters form the essential part of medical sterilisation devices in which liquid is present on one side of the plate of piezoelectric material. With the application of a voltage to opposite sides of the plate the liquid is caused to oscillate. The quickness of the oscillating liquid produces cavitation zones which produce very high temperatures upon imploding. Germs or viruses in liquids are thereby killed.

The applicants themselves use ultrasonic power converters according to DE41 01 303 Al of Pōschl et. al. for the high-pressure atomization of liquid fuel which was published on Jul. 30, 1982 after the claimed priority data. In this connection the plate of piezoelectric material is fixed to an aperture in a wall. Fuel impinges on the opposite sides of the plate, i.e. on both sides, in order for the fuel to be foamed by means of the cavitation zones produced by the plate oscillating at ultrasonic frequency. Decisive for the function of the plate of piezoelectric material is that its upper and lower sides be in complete liquid-tight isolation from one another and that, furthermore, the upper and lower sides be electrically isolated from one another. Otherwise, liquid connecting the upper with the lower side would act as an electric bridge for the voltage applied between the upper and lower sides, which would cause a short circuit.

To avoid this short circuit, according to the internal state of the art of the applicant, for a holder it has already been proposed to provide the plate of piezoelectric material with a seal of electrically insulating material at its periphery, whereby the upper and lower sides of the plate are sealed liquid-tight and electrically isolated from one another. In addition, a holding means is used to fix the plate at the aperture in the wall. The wall in this case divides a container into which the liquid fuel is conducted into two chambers. The chambers communicate with one another via a long fuel line.

The problem of liquid-tight sealing exists not only when liquid impinges on both sides of plates of piezoelectric material, but also when liquid impinges only on one side.

In the holder according to the aforementioned older proposal of the applicant it has been shown that problems with the liquid-tight sealing could not be ruled out and short circuits frequently occurred. Moreover, the soldered joints at which the electric lines were connected to the associated upper and lower sides of the plate very frequently broke, since the plate oscillates at ultrasonic frequency and is thus constantly in motion. Another disadvantage is that a silver coating of the plate tends to oxidate.

DISCLOSURE OF INVENTION

The object of the invention is, in a holder according to the preamble of claim 1, both to guarantee the liquid-tight sealing and the electrical isolation of the upper and lower sides of the plate of piezoelectric material and to improve the electrical connection of the voltage source to the plate, without restricting its freedom of movement.

The object is fulfilled in accordance with the invention by the features of claim 1.

What is achieved with the holder according to the invention is that the seal is compressed not only between the holding means and the wall, but additionally between the plate and an intermediate ring enclosing the seal, thus ensuring the liquid-tight sealing. Moreover, the plate of piezoelectric material is clamped between two thin electrically conducting contact plates lying against its upper and lower sides. The contact plates are connected to an electric voltage source via electric wires. By this means it becomes unnecessary to solder the electric wires to the upper and lower sides of the plate of piezoelectric material. The electric voltage is applied uniformly to the edges of the upper and lower sides of the plate, as the contact plate is provided with an aperture which is slightly smaller than the plate. The contact plates touch the plate of piezoelectric material only at its edges, where they also clamp it in place. The contact plates are relatively thin and consist of resilient material, so that the oscillation of the plate at ultrasonic frequency is not impeded.

Advantageous embodiments of the invention form the subject matters of the subclaims.

In the embodiment of the invention according to claim 2, the plate is elastically clamped by resiliently flexible fingers grasping its upper and lower sides. The contact between the fingers and the upper or lower side takes place in a broken line. The oscillatory movement of the plate is thereby hardly hampered at all. The resilient fingers serve for the current transfer from the contact plates to the plate of piezoelectric material. The large number of fingers ensures a uniform distribution of the voltage (a high voltage of 1 kv per millimeter thickness of the piezoelectric material is commonly used) over the piezoelectric material.

In the embodiment of the invention according to claim 3, two annular discs form flat supporting surfaces for the adjacent contact plates. The upper annular disc additionally acts as a holding means for the plate, the contact plates, the seal, the lower annular disc and the surrounding intermediate ring, disposed between the upper annular disc and the wall.

In the embodiment of the invention according to claim 4, the plate of piezoelectric material is circular, for which reason the seal can be provided as a simple toroidal sealing ring and the annular discs are substantially circular and hence simple to manufacture.

In the, embodiment of the holder according to claim 5 the contact plates consist of spring steel, whereby particularly the elasticity of the fingers is improved.

The possibility of an electrical short circuit of the voltage applied to the upper and lower sides of the plate is further reduced according to the embodiment of the invention in claim 6.

An additional simplification for the manufacture of the annular discs arises in the embodiment of the invention according to claim 7. The upper and lower annular discs herein have the same design, so that the number of different parts used in the holder is reduced.

To be sure, in the embodiment of the invention according to claim 8, the contact plate at the upper annular disc is pressed firmly onto the upper side of the plate of piezoelectric material; however, due to the larger aperture the contact plate can also deform more easily and adapt to the seal, which further reduces the force for clamping the plate of piezoelectric material. In this embodiment the plate of piezoelectric material is supported only on one side. This permits it to oscillate on the opposite side over its entire effective surface.

The embodiment of the invention according to claim 9 serves for better fixing the holder at the aperture.

The embodiment of the invention according to claim 10 results in substantial cost savings, as the plate of piezoelectric material no longer has any electrically conductive coating at all on the upper and lower sides, but rather the piezoelectric material is bare. The coating becomes unnecessary, since the contact plates make possible a low-loss electrically conductive connection across the entire periphery of the upper and lower sides of the plate of piezoelectric material.

One preferred embodiment of the present invention is described in greater detail below, with reference to the drawings.

BEST MODE OF CARRYING OUT THE INVENTION

Figure 1:
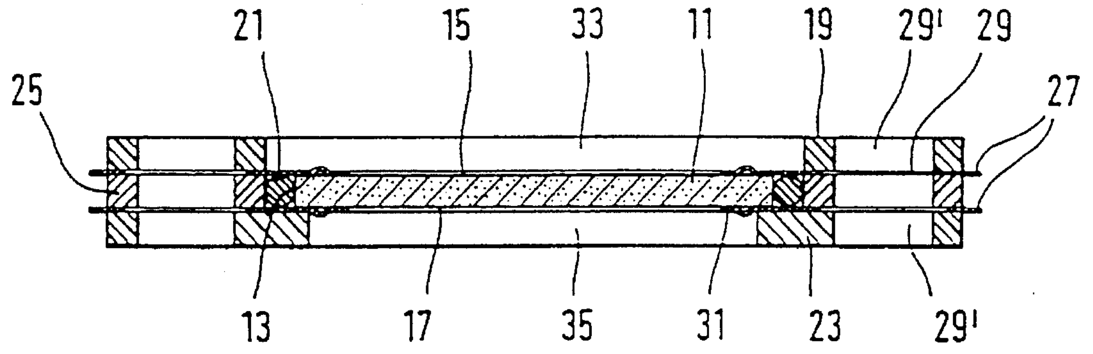
FIG. 1 shows a cross section of a holder according to the invention.

FIG. 1 shows a holder for an ultrasonic power converter or oscillator in the form of a circular plate 11 of piezoelectric material, having a peripheral surface 13, as well as an upper side 15 and an opposite lower side 17. The piezoelectric material is bare on the upper and lower sides 15, 17 of the plate 11, i.e. the plate 11 has no electrically conductive coating. A seal 21 in the form of a toroidal sealing ring abuts the peripheral area 13 of the plate 11. An intermediate ring 25 is located radially outside of the seal 21. The diameter of the plate 11 and the gross-sectional thickness of the toroidal sealing ring 21, as well as The inner diameter of the intermediate ring 25 are adapted to one another in such a way-that there is no radial play between any of these three parts, in order to thereby enhance the sealing effect. The thickness of the plate 11 and that of the intermediate ring 25 are nearly equal to, but somewhat less than the cross-sectional thickness of the toroidal sealing ring 21. The plate 11 consists of piezoelectric ceramics and the intermediate ring 25 of an insulating material such as that used for printed circuit boards.

The plate 11 is clamped between two thin contact plates 27 of stainless spring steel lying against the upper and/or lower side 15, 17 of plate 11. The contact plates 27 have a centric aperture with a diameter slightly larger than that of the plate 11. Radial fingers 31 supporting the plate 11 project inwardly from the periphery of the centric aperture so that the inner width of the centric aperture is slightly smaller than the diameter of the plate 11. By this means the plate 11 is touched and clamped by the fingers 31 of the contact plates 27 only at its peripheral edges. Above the contact plate 27 lying against the upper side 15 of the plate 11, an upper annular disc 19 is disposed concentrically to the plate 11. The contact plate 27 on the lower side 17 of the plate 11 is in turn uniformly supported by a lower annular disc 23. The upper and lower annular discs 19, 23 consist likewise of an insulating material such as that used for printed circuit boards. The upper annular disc 19 has an aperture 33 slightly larger than a corresponding aperture 35 in the lower annular disc 23. The diameter of the aperture 33 approximately corresponds to the inner diameter of the intermediate ring 25, in order that in the assembly and resultant clamping together of the holder the contact plate 27 on the upper side 15 of the plate 11 can better adapt itself to the toroidal sealing ring 21 and the effective area of the plate 11 is thereby enlarged. The diameter of the aperture 35 is smaller than the outer diameter of the plate 11, in order to form an annular support surface for the contact plate 27 on the lower side 17 of the plate 11.

Figure 2:
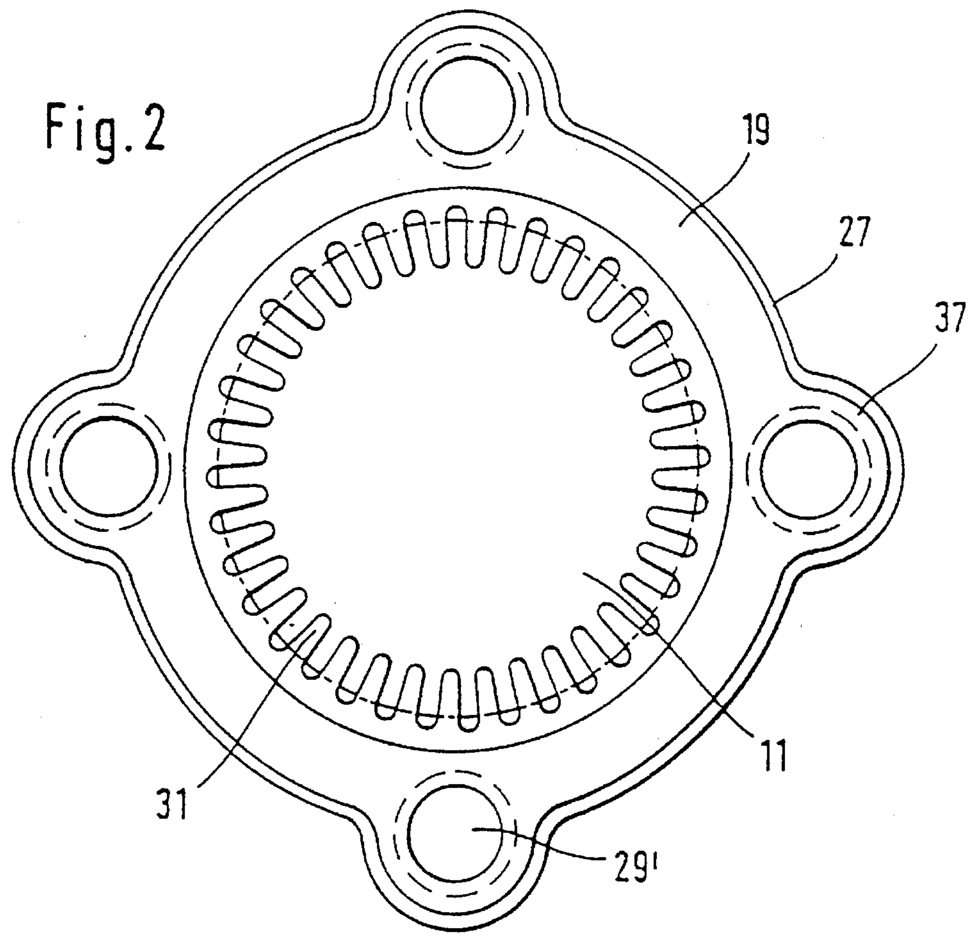
FIG. 2 shows a plan view of the holder according to FIG. 1.

In FIG. 2 the outer configuration of the holder and its parts can be recognized. The apertures of the contact plates 27 herein are provided with a plurality of small, inwardly directed fingers 31 additionally bent in a common direction towards the plate 11, as shown in FIG. 1. In the assembly of the holder, the contact plates 27 are arranged and the thickness of the intermediate ring 25 is selected in such a way that the small bent fingers 31 always point towards the plate 11 and the plate 11 is resiliently clamped by the fingers 31 grasping the upper and lower sides 15, 17.

The outer configurations of the upper and lower annular discs 19, 23 and of the intermediate ring 25 are equal in diameter. The outer configuration of the contact plates 27, however, is somewhat larger in diameter, so that the contact plates 27 protrude somewhat beyond the annular discs 19, 23 and the intermediate ring 25. The annular discs 19, 23, the intermediate ring 25 and the contact plates 27 have four radially outwardly extending eye-like projections 37, each provided with a through hole 29' or 29 for receiving screws to mount the holder. In addition, the through holes 29 of the contact plates 27 are larger than the through holes 29' of the annular discs 19, 23 and of the intermediate ring 25, in order that there be no physical contact at all with the contact plates 27 upon insertion of the screws, whereby an electrically conductive connection between the two contact plates 27 via the screws themselves would occur.

Figure 3:
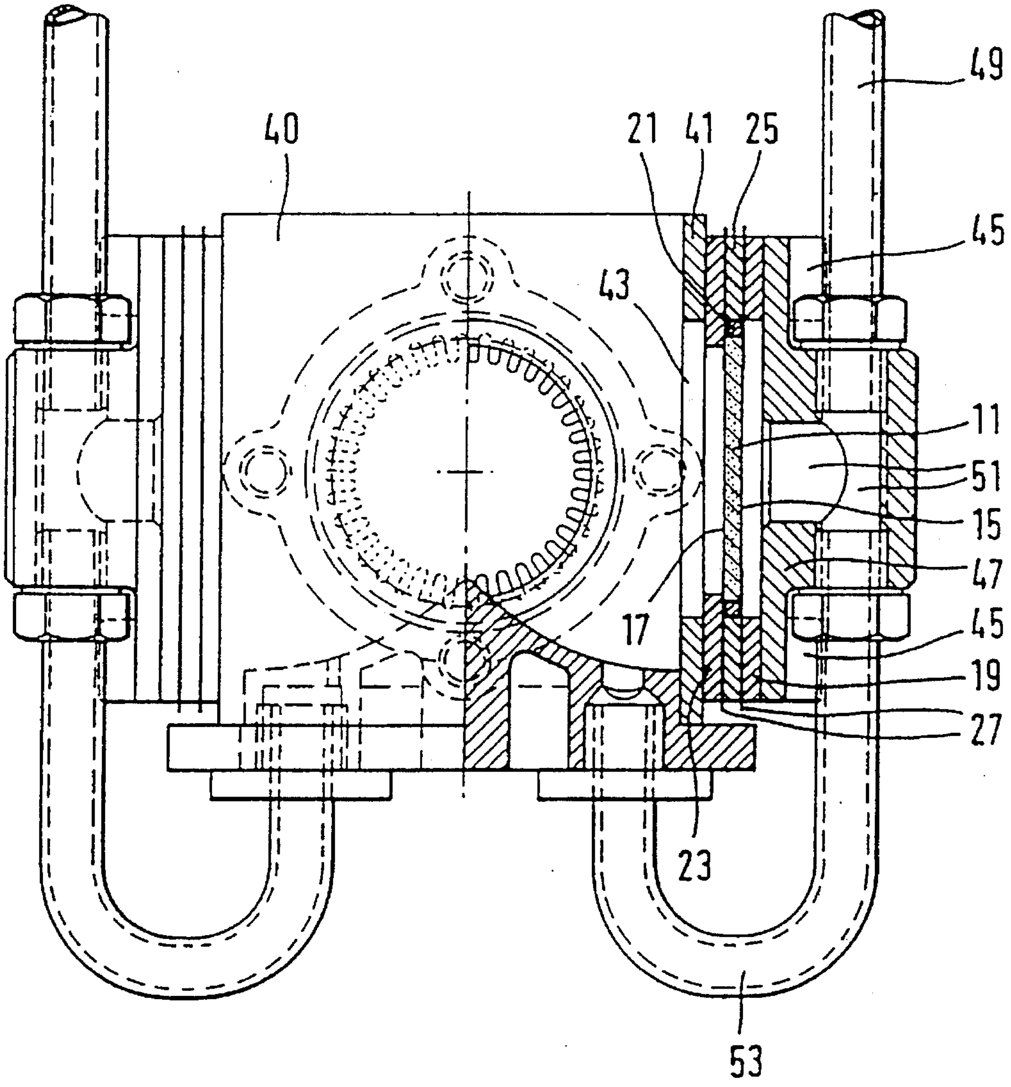
FIG. 3 shows a view with examples of installation of the holder according to FIGS. 1 and 2 in a housing.

FIG. 3 shows installation examples of the holder in a cubical housing 40. Four adjacent sidewalls 41 of the housing 40 are provided with one centric aperture 43 each. At each aperture 43 a holder is fastened to the walls 41 from the outside by means of four screws 45. The holder is closed to the outside by a cover 47 lying against the upper annular disc 19. As mentioned above, the contact plates 27 protrude outwardly somewhat beyond the outer configuration of the annular discs 19, 23 and of the intermediate ring 25, so that one electric wire each, leading to a not shown voltage source, can be attached at these places. When the cover 47 is screwed to the walls 41, the parts of the holder are simultaneously pressed together and clamped down so that the toroidal sealing ring deforms and reaches complete physical contact with the contact plates 27, the plate 11 and the intermediate ring 25. This ensures that when liquid fuel impinges on the upper and lower sides 15, 17 of the plate 11, the fuel does not act as an electric bridge between the upper and the lower sides 15, 17.

The liquid fuel is supplied via a conduit 49 to the cover 47, which has bores 51 conducting the liquid fuel to the upper side 15 of the plate 11 on the one hand and via a U-shaped conduit 53 into the interior of the housing 40 to the lower side 17 on the other. The U-shaped conduit 53 herein is so long that the liquid fuel flowing through it and connecting the upper side 15 with the lower side 17 of the plate 11 has sufficient electric resistance to prevent the occurrence of a short circuit. The conduit 53 in this serves at the same time as a heat exchanger, for the liquid fuel flowing through it absorbs heat from the plate 11 of piezoelectric material, which the conduit 53 gives off to the surrounding area in its U-shaped part.

A voltage from the voltage source is applied via associated electric wires and the contact plates 27 to the upper and lower sides 15, 17 of the plate 11 of piezoelectric material. The plate 11 is thereby caused to oscillate and transfers these oscillations to the liquid fuel, which is foamed due to resulting cavitation zones.

The plate 11 is elastically clamped between the fingers 31 of the contact plates 27 only at its outer edges, so that the oscillatory movement can take place virtually unimpeded and, nevertheless, a secure, liquid-tight seal and electrical isolation between the upper and lower sides 15, 17 of the plate 11 are ensured.

For optimal exploitation of the oscillatory movement of the plate 11, liquid fuel impinges on the upper and lower sides 15, 17. Liquid fuel impinging from one side only onto the lower side 17 would have the disadvantage that the plate 11 would heat up and lose its effectiveness. In this case, the side not impinged on by fuel would have to be impinged on by air to ensure heat removal by convection. A disadvantage of this would be that the ultrasonic oscillator could not be installed in the wall of a container with a pressurized interior. The ultrasonic oscillator would turn into a rupture disc.

One alternative embodiment consists in that the seal 21 and the intermediate ring 25 are provided as one part.

I claim:

1. A holder for fixing an ultrasonic power converter to an aperture (43) in a wall (41), the ultrasonic power converter comprising a plate (11) of piezoelectric material having a peripheral surface (13) and an upper and a lower side (15, 17) impinged on by liquid, the holder comprising a) at least one seal (21) of electrically insulating material, said seal (21) being arranged at the periphery of the plate (11) of piezoelectric material for a liquid-tight seal and for electrical isolation of the upper from the lower side (15, 17) of the fixed plate (11) of piezoelectric material, b) at least one holding means for fixing the plate (11) together with the other parts of the holder to the aperture (43) in the wall (41), c) two thin contact plates (27) of resilient, electrically conductive material, each contact plate (27) having an aperture with an inner width slightly smaller than the diameter of the plate (11) of piezoelectric material so that the plate (11) of piezoelectric material is clampable on both sides (15, 17) between the contact plates (27), and d) an intermediate ring (25) disposed between the two contact plates (27) enclosing the seal (21), wherein said intermediate ring (25) further has an inner aperture width adapted to the outer width of the plate (11) of piezoelectric material so that the intermediate ring (25) is spaced peripherally from the plate (11) of piezoelectric material in its fixed position, and the Seal (21) encloses the outer periphery of the plate (11) of piezoelectric material and is positively fitted between the peripheral surface (13) and the intermediate ring (25).

2. A holder according to claim 1, characterized in that the aperture of the contact plates (27) is provided with a plurality of small, inwardly directed fingers (31) bent towards the plate (11) of piezoelectric material, whereby the plate (11) of piezoelectric material is clamped by the fingers (31) grasping the upper and lower sides (15, 17) thereof.

3. A holder according to claim 1, characterized in that a lower annular disc (23) is located beneath the contact plate (27) lying against the lower side (17) of the plate (11) of piezoelectric material, and that an upper annular disc (19) is located as a holding means above the contact plate (27) lying against the upper side (15) of the plate (11) of piezoelectric material.

4. A holder according to claim 3, characterized in that the plate (11) of piezoelectric material is circular, that the seal (21) is a toroidal sealing ring and that the upper and lower annular discs (19, 23) are substantially in the shape of a circular ring.

5. A holder according to claim 1, characterized in that the contact plates (27) consist of spring steel.

6. A holder according to claim 3, characterized in that the upper and lowr annular discs (19, 23) and the intermediate ring (25) consist of electrically insulating material or are at least provided with an insulating coating on their surfaces.

7. A holder according to claim 3, characterized in that the upper and lower annular discs (19, 23) have the same design.

8. A holder according to claim 3, characterized in that the upper annular disc (19) has a larger aperture (33) than the lower annular disc (23).

9. A holder according to claim 3, characterized in that the upper and lower annular discs (19, 23), the intermediate ring (25) and the contact plates (27) have through holes (29', 29) receiving screws (45) for screwing the holder to the wall (41).

10. A holder according to claim 1, characterized in that the piezoelectric material on the upper and lower sides (15, 17) of the plate (11) is bare.

11. A holder according to claim 1, characterized in that the seal (21) and the intermediate ring (25) comprise one part.

* * * * *